United States Patent
Chen et al.

(10) Patent No.: US 12,211,910 B2
(45) Date of Patent: Jan. 28, 2025

(54) BIPOLAR JUNCTION TRANSISTOR (BJT) AND FABRICATING METHOD THEREOF

(71) Applicant: TAIWAN SEMICONDUCTOR MANUFACTURING COMPANY, LTD., Hsinchu (TW)

(72) Inventors: Kuan-Jung Chen, Hsinchu (TW); Chun-Ming Lin, Taichung (TW); Tsung-Lin Lee, New Taipei (TW); Shiuan-Jeng Lin, Hsinchu (TW); Hung-Lin Chen, Pingtung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 498 days.

(21) Appl. No.: 17/461,193

(22) Filed: Aug. 30, 2021

(65) Prior Publication Data
US 2023/0062567 A1    Mar. 2, 2023

(51) Int. Cl.
*H01L 29/417*   (2006.01)
*H01L 29/06*    (2006.01)
*H01L 29/08*    (2006.01)

(52) U.S. Cl.
CPC .... *H01L 29/41708* (2013.01); *H01L 29/0649* (2013.01); *H01L 29/0804* (2013.01); *H01L 29/0821* (2013.01)

(58) Field of Classification Search
CPC ............. H01L 29/0649; H01L 29/0692; H01L 29/0804; H01L 29/0813; H01L 29/0821; H01L 29/41708; H01L 29/42304; H01L 29/7322
See application file for complete search history.

(56) References Cited

U.S. PATENT DOCUMENTS

| | | | | |
|---|---|---|---|---|
| 2006/0175635 | A1* | 8/2006 | Arai | H01L 29/0692 257/E29.026 |
| 2010/0187657 | A1* | 7/2010 | Boeck | H01L 29/0649 438/335 |
| 2010/0327280 | A1* | 12/2010 | Joseph | H01L 21/76229 257/E29.174 |
| 2013/0113021 | A1* | 5/2013 | Qian | H01L 21/2253 438/318 |
| 2013/0270649 | A1* | 10/2013 | Chantre | H01L 29/66234 257/378 |
| 2015/0287716 | A1* | 10/2015 | Babcock | H01L 27/082 438/327 |
| 2016/0079345 | A1* | 3/2016 | Vanhoucke | H01L 29/36 438/335 |
| 2016/0163685 | A1* | 6/2016 | Jain | H01L 29/7371 438/359 |
| 2016/0240636 | A1* | 8/2016 | Shyu | H01L 21/76232 |
| 2019/0181250 | A1* | 6/2019 | Jain | H01L 29/1004 |

* cited by examiner

*Primary Examiner* — Mark W Tornow
*Assistant Examiner* — Priya M Rampersaud
(74) *Attorney, Agent, or Firm* — Birch, Stewart, Kolasch & Birch, LLP

(57) ABSTRACT

Bipolar junction transistor (BJT) structures are provided. A BJT structure includes a semiconductor substrate, a collector region formed in the semiconductor substrate, a base region formed over the collector region, an emitter region formed over the collector region, a ring-shaped shallow trench isolation (STI) region formed in the collector region, and a base dielectric layer formed over the collector region and on opposite sides of the base region. The base dielectric layer is surrounded by an inner side wall of the ring-shaped STI region.

20 Claims, 10 Drawing Sheets

BIPOLAR JUNCTION TRANSISTOR (BJT) AND FABRICATING METHOD THEREOF

BACKGROUND

A bipolar junction transistor (BJT) is a three-terminal device. The three terminals include a base terminal, a collector terminal, and an emitter terminal. BJTs are formed by two P-N junctions placed back-to-back in close proximity to each other, with one of the regions common to both junctions. There is a first junction between the base and the emitter, and a second junction between the emitter and the collector. This forms either a P-N-P or N-P-N transistor depending upon the characteristics of the semiconductor materials used to form the BJT. The terminals of the BJT are connected to their respective base, collector, and emitter. In BJTs, the current flow through the emitter and collector terminals is controlled by the voltage across the base and emitter terminals.

As the semiconductor industry has progressed into nanometer technology process nodes in pursuit of higher device density, higher performance, and lower costs, various techniques have been implemented to improve BJT device performance.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
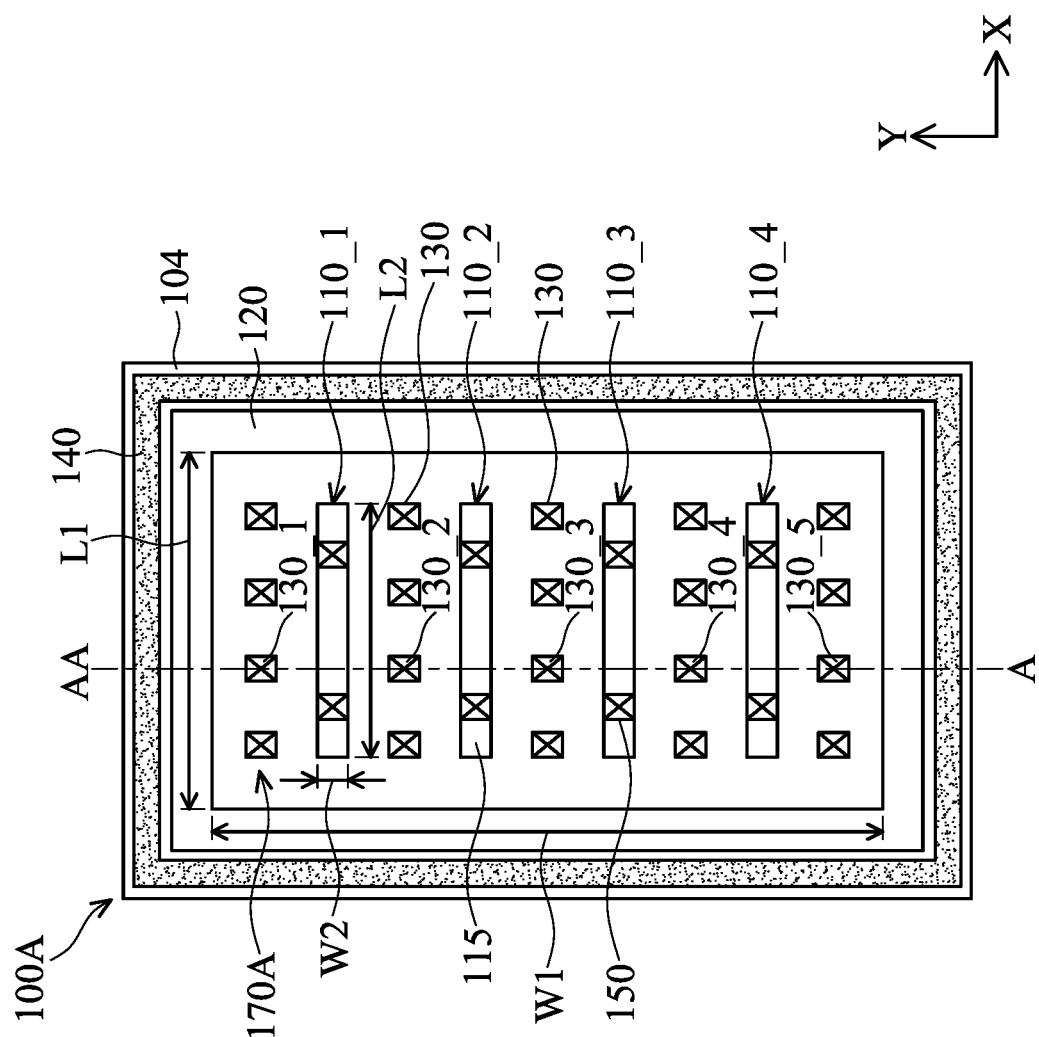
FIG. 1 shows a top view of a BJT, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Bipolar junction transistors (MI's) are commonly used in digital and analog integrated circuit (IC) devices for high frequency applications. A BJT includes two P-N junctions sharing a cathode or anode region, which is called the base. The base separates two regions having the same conductivity type, called the emitter and the collector, which is opposite of the conductivity type of the base. Depending on the conductivity types, a BJT can be of the NPN variety or the PNP variety.

The breakdown mechanism of BJT is similar to that of P-N junction. Since the base-collector junction is reverse biased, breakdown usually occurs at the P-N junction. Generally, the breakdown voltage BVceo of BJT depends on the selected circuit configuration. In the common base mode (that is, the base is grounded, a common electrode is formed between the emitter-base input and the collector-base output of the device), the breakdown is similar to that of a P-N diode. In the common emitter mode (that is, the operation of grounding the emitter and forming a common electrode between the base-emitter input and collector-emitter output of the device), the breakdown will affect IV characteristics and breakdown voltage BVceo of the BJT.

Once breakdown occurs, high voltage and rapidly increasing current may cause a large amount of heat dissipation in the devices with BJT, which may permanently damage the devices. Therefore, for the high voltage device with BJT, such as a power device, the electrostatic discharge (ESD) device and so on, it is important to increase the breakdown voltage BVceo for the BJT. In the ionized metal plasma (IMP) process, phosphorus (P) tends to accumulate at the sidewalls of the shallow trench isolation (STI) in the collector of the BJT, resulting in a decrease in the breakdown voltage BVceo of the BJT. However, it is difficult to use a lighter dose to increase the breakdown voltage BVceo of the BJT, because the IMP dose may reach minimum dose limitation of the IMP tool.

Therefore, the present disclosure is directed to a BJT having higher breakdown voltage BVceo by increasing an area (e.g., P-type active area or N-type active area, also named as the oxide diffusion (OD) area) for the BJT to increase a distance (or a space) between the emitter and the STI, thereby eliminating STI cumulated phosphorus effect. In addition, compared with the traditional BJT with multiple emitter regions in layout, no STI is formed between the emitter regions of the BJTs of the embodiments.

FIG. 1 shows a top view of a BJT 100A, in accordance with some embodiments of the disclosure. The BJT 100A includes 4 emitter regions 110_1 through 110_4 formed on the collector region 104 and extending in an X direction. Multiple emitter contacts 150 are formed over the emitter regions 110_1 through 110_4. In some embodiments, the emitter contacts 150 are configured to connect a first conduction line (not shown) on the upper layer, such as VDD, VSS or signal line. A collector contact 140 is formed on the collector region 104, and the collector contact 140 forms a ring in the BJT 100A. In other words, the collector contact 140 is a ring-shaped contact in layout. In some embodiments, the collector contact 140 is configured to connect a second conduction line (not shown) on the upper layer, such as VDD, VSS or signal line. A shallow trench isolation (STI) region 120 is formed between the emitter regions 110_1 through 110_4 and the collector contact 140. Furthermore, the STI region 120 is separated from the emitter regions 110_1 through 110_4 and the collector contact 140. The STI region 120 forms a ring in the BJT 100A, and the STI region 120 is a ring-shaped STI region in layout. Furthermore, the ring of the STI region 120 is surrounded by the ring of the collector contact 140.

In the BJT 100A, multiple base contacts 130 are formed between the emitter regions 110_1 through 110_4, between the emitter region 110_1 and the STI region 120 and between the emitter region 110_4 and the STI region 120. Each base contact 130 is configured to connect the base region that will be described later. Moreover, the base contacts 130 are divided into a first group and a second group. The first group of base contacts are arranged in the lines between the emitter regions 110_1 through 110_4 and along an X direction, and the second group of base contacts are arranged in the lines between the emitter region 110_1 and the STI region 120 and the emitter region 110_4 and the STI region 120 and along the X direction. For example, the first group of four base contacts 130 is formed between the emitter regions 110_1 and 110_2, and the four base contacts 130 are arranged in a line extending along the X direction. Moreover, the second group of four base contacts 130 is formed between the emitter region 110_1 and the STI region 120, and the four base contacts 130 are also arranged in a line extending along the X direction. In some embodiments, the base contacts 130 are configured to connect a third conduction line (not shown) on the upper layer, such as VDD, VSS or signal line. In some embodiments, the number of base contacts 130 arranged in a line along the X direction is greater than 2.

In the BJT 100A, the collector region 104 has a first conductivity type (e.g., N-type with a first doping concentration), and the emitter regions 110_1 through 110_4 have the first conductivity type (e.g., N-type with a second doping concentration that is different from the first doping concentration). The collector region 104, the base region having a second conductivity type (e.g., P-type), and the emitter regions 110_1 through 110_4 are each made of semiconductor material. In some embodiments, the collector region 104, the base region, and the emitter regions 110_1 through 110_4 are configured in an N-P-N arrangement. In some embodiments, the collector region 104, the base region, and the emitter regions 110_1 through 110_4 are configured in P-N-P arrangement.

In some embodiments, the collector contact 140, the base contacts 130 and the emitter contacts 150 include one or more conductive materials including copper (Cu), aluminum (Al), tungsten (W), etc. Furthermore, the collector contact 140, the base contacts 130 and the emitter contacts 150 are arranged within an inter-layer dielectric (ILD) (not shown).

In the BJT 100A, the collector contact 140 forms a single loop to surround the STI region 120, i.e., no collector contact is present inside the single loop of the collector contact 140. The STI region 120 forms a single loop to surround the base contacts 130 and the emitter regions 110, i.e., no STI region is present inside the single loop of the STI region 120. An OD area 170A of the collector region 104 is surrounded and defined by the single loop of the STI region 120, and the OD area 170A has a width W1 in the Y direction and a length L1 in the X direction. In some embodiments, the width W1 is greater than the length L1. The base contacts 130, the emitter contacts 150 and the emitter regions 110_1 through 110_4 are formed over the OD area 170A of the collector region 104.

In the BJT 100A, an emitter area 115 represents an area of each of the emitter regions 110_1 through 110_4 projected onto the OD area 170A. The emitter area 115 has a width W2 in the Y direction and a length L2 in the X direction. The width W2 is less than the width W1 and the length L2 is less than the length L1. In some embodiments, the OD area 170A is 3 to 8 times larger than the whole emitter areas 115 of the emitter regions 110_1 through 110_4. In some embodiments, the OD area 170A is 4.6 to 5.3 times larger than the whole emitter areas 115 of the emitter regions 110_1 through 110_4.

Figure 2:
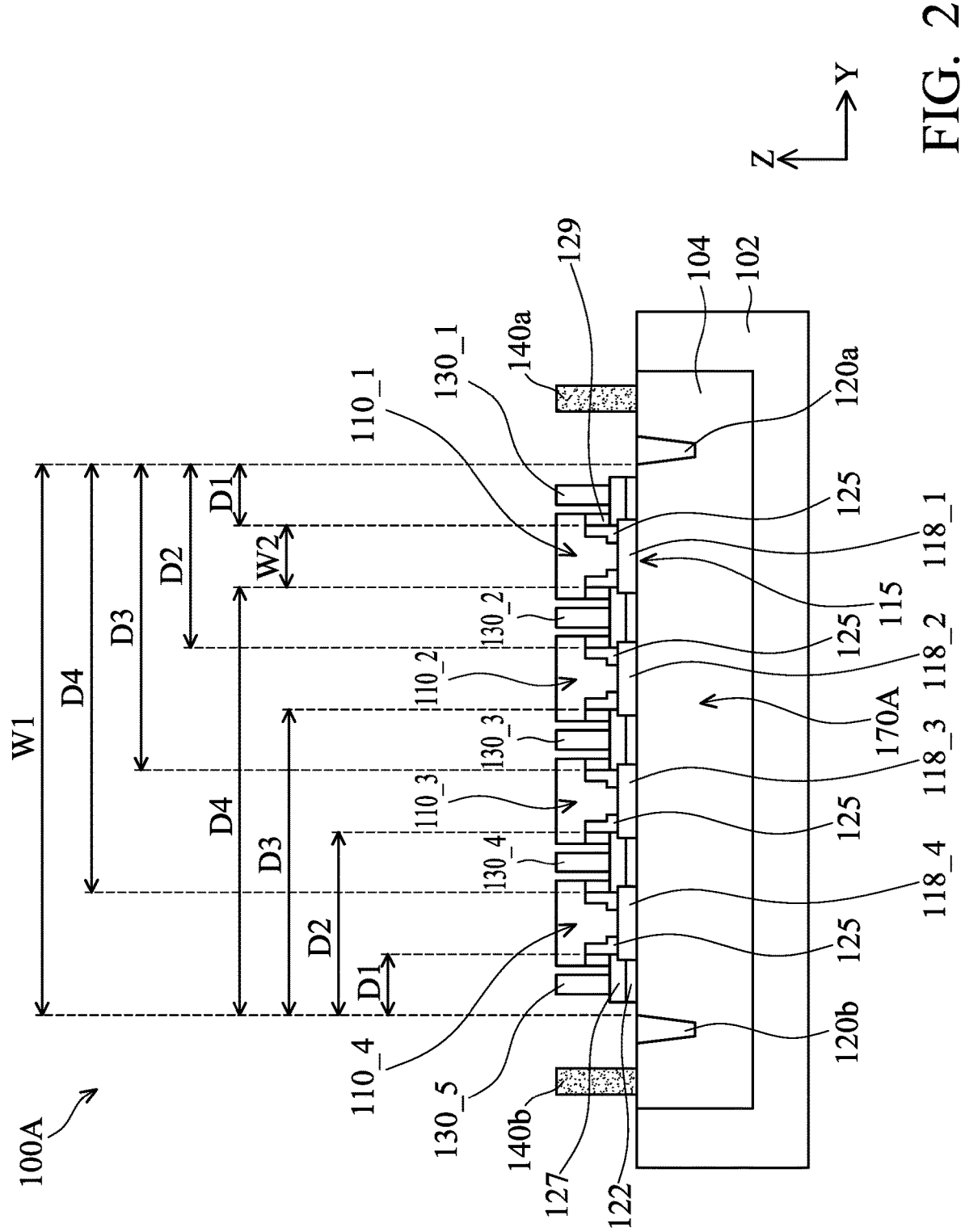
FIG. 2 shows a cross-sectional view of the BJT along line A-AA in FIG. 1, in accordance with some embodiments of the disclosure.

FIG. 2 shows a cross-sectional view of the BJT 100A along line A-AA in FIG. 1, in accordance with some embodiments of the disclosure. The collector region 104 is formed in a semiconductor substrate 102, and the collector region 104 has a first conductivity type. The collector region 104 has been formed through the implantation of one or more dopants or IMP process. In some embodiments, the first conductivity type is N-type, and the collector region 104 include, for example, phosphorous (P), arsenic (As), antimony (Sb), or bismuth (Bi), etc., which forms an N-type collector region 104. The substrate 102 can be a bulk silicon substrate, a silicon-on-insulator substrate, a binary compound semiconductor substrate, ternary compound semiconductor substrate, or higher order compound semiconductor substrate, among others.

In some embodiments, the STI region 120 is formed in the semiconductor substrate 102. In the BJT 100A, the STI region 120 is formed within the collector region 104. For convenience of explanation, the STI region 120 on the right is labeled as 120a, and the STI region 120 on the left is marked as 120b in FIG. 2. Furthermore, the emitter regions 110_1 through 110_4 are sequentially arranged between the STI regions 120a and 120b. In such embodiment, the STI region 120a is close to the emitter region 110_1, and the STI region 120b is close to the emitter region 110_4. It is also noted that the OD area 170A is defined by the STI regions 120a and 120b, and no other STI region 120 is formed within the OD area 170A.

In some embodiments, the BJT 100A includes the deep trench isolation (DTI) structures (not shown), which laterally isolate the collector region 104 from other regions of the semiconductor substrate 102.

The collector contact 140 is formed over the collector region 104. For convenience of explanation, the collector contact 140 on the right is labeled as 140a, and the collector contact 140 on the left is marked as 140b in FIG. 2. In some embodiments, the collector contact 140a/140b is disposed outside of the OD area 170A. Moreover, the collector contact 140a and the OD area 170A are disposed on opposite sides of the STI region 120a, and the collector contact 140b and the OD area 170A are disposed on opposite sides of the STI region 120b.

In some embodiments, the collector contact 140 is divided into multiple sub-contacts. Furthermore, the sub-contacts are formed over the OD area 170A of the collector region 104.

The base regions 118_1 through 118_4 are formed over the collector region 104 of the OD area 170A. Each of the base regions 118_1 through 118_4 meets the collector region 104 at a collector/base junction. In such embodiments, the BJT 100A is the BJT having four collector/base junctions. In other words, the base regions 118_1 through 118_4 share the collector region 104.

The emitter regions 110_1 through 110_4 are formed over the base regions 118_1 through 118_4, respectively. As described above, each of the emitter regions 110_1 through 110_4 projected onto the OD area 170A is the emitter area 115. Each of the emitter regions 110_1 through 110_4 meets the base regions 118_1 through 118_4 at the corresponding (or individual) base/emitter junction. In such embodiments, the BJT 100A is the BJT having four base/emitter junctions.

In the BJT 100A, a base dielectric layer 122 is formed over the OD area 170A of the collector region 104 and on opposite sides of the base regions 118_1 through 118_4. Furthermore, the base dielectric layer 122 is in contact with the base regions 118_1 through 118_4. In some embodiments, the base dielectric layer 122 includes an oxide that is formed by chemical vapor deposition (CVD), oxidation of the upper surface of the semiconductor substrate 102, or other appropriate dielectric layer formation technique. It is noted that the base dielectric layer 122 is in full contact with the collector region 104.

A base conductive layer 127 (e.g., polysilicon) is formed over the base dielectric layer 122. Moreover, the base conductive layer 127 is in contact with the base regions 118_1 through 118_4. In some embodiments, the base conductive layer 127 is polysilicon, and the base dielectric layer 122 is an oxide (e.g., SiO2). Furthermore, the base conductive layer 127 is in contact with the base regions 118_1 through 118_4 along vertical sidewalls and an upper surface of the base regions 118_1 through 118_4. In some embodiments, the base regions 118_1 through 118_4 only contacts the base conductive layer 127 along its vertical surface. Furthermore, the STI region 120a is laterally separated from the base region 118_1 by the base dielectric layer 122, and the STI region 120b is laterally separated from the base region 118_4 by the base dielectric layer 122.

For each of the emitter regions 110_1 through 110_4, a spacer layer 125 (e.g., silicon nitride (SiN)) is arranged along vertical sidewalls (e.g., along a Z direction) and part of the lower surface (e.g., along a Y direction) of the corresponding emitter region, i.e., the spacer layer 125 has a L-shape in FIG. 2. In some embodiments, the spacer layer 125 is arranged only along vertical sidewalls of the corresponding emitter region. The spacer layer 125 is configured to electrically isolate a lower portion of the emitter regions 110_1 through 110_4 from the base conductive layer 127.

A dielectric layer 129 is formed to separate outer edges of the emitter regions 110_1 through 110_4 from the base conductive layer 127. In some embodiments, the dielectric layer 129 is an inter-poly dielectric (IPD) layer, such as SiN. In some embodiments, the upper surface of the dielectric layer 129 is aligned with the upper surface of the spacer layer 125.

The base contacts 130_1 through 130_5 are formed over the base conductive layer 127. The base contacts 130_1 through 130_5 are configured to connect the base regions 118_1 through 118_4 to a conduction line (not shown) on the upper layer through the base conductive layer 127. For example, the base contact 130_4 is configured to connect the base regions 118_3 and 118_4 to the conduction line (not shown) on the upper layer through the base conductive layer 127, and the base contact 130_1 is configured to connect the base region 118_1 to the conduction line (not shown) on the upper layer through the base conductive layer 127. In some embodiments, the emitter regions 110_1 through 110_4 are separated from the base contacts 130_1 through 130_5 by the ILD (not shown). Furthermore, the areas of the base contacts 130_1 through 130_5 projected onto the OD area 170A is separated from the STI region 120a/120b.

In FIG. 2, each of the emitter regions 110_1 through 110_4 is far away from the STI region 120a/120b. For example, a distance between the STI region 120a and the emitter area 115 of the emitter region 110_1 is D1. A distance between the STI region 120a and the emitter area 115 of the emitter region 1102 is D2, and D2 is greater than D1, i.e., D1 is the minimum distance in FIG. 2. A distance between the STI region 120a and the emitter area 115 of the emitter region 110_3 is D3, and D3 is greater than D2. A distance between the STI region 120a and the emitter area 115 of the emitter region 110_4 is D4, and D4 is greater than D3, i.e., D4 is the maximum distance in FIG. 2. Similarly, a distance between the STI region 120b and the emitter area 115 of the emitter region 110_4 is D1, a distance between the STI region 120b and the emitter area 115 of the emitter region 110_3 is D2, a distance between the STI region 120b and the emitter area 115 of the emitter region 1102 is D3, and a distance between the STI region 120b and the emitter area 115 of the emitter region 110_1 is D4. For each of the emitter regions 110_1 through 110_4, a distance between the emitter region and the STI region 120a is different from a distance between the emitter region and the STI region 120b. Taking the emitter region 110_3 as an example, the distance between the emitter region 110_3 and the STI region 120a is D3, and the distance between the emitter region 110_3 and the STI region 120b is D2.

In some embodiments, the difference between the distances D1 and D2, the difference between the distances D2 and D3, and the difference between the distances D3 and D4 are the same and equal to the fixed distance Dx, i.e., D2-D1=D3-D2=D4-D3=Dx. In some embodiments, the difference between the distances D1 and D2, the difference between the distances D2 and D3, and the difference between the distances D3 and D4 are different.

In some embodiments, the width W1 of the OD area 170A is determined according to the maximum distance D4, the minimum distance D1 and the width W2 of the emitter area 115. For example, the width W1 of the OD area 170A is the sum of the maximum distance D4, the minimum distance D1 and the width W2, e.g., W1=D4+D1+W2.

In FIG. 1 and FIG. 2, the STI region 120 is a ring-shaped STI having a single continuous inner side wall and a continuous outer side wall. The OD area 170A of the BJT 100A is surrounded by the continuous inner side wall of the STI region 120. In other words, the emitter regions 110_1 through 110_4, the base regions 118_1 through 118_4 and related components (e.g., the base dielectric layer 122, the base conductive layer 127, the spacer layer 125 and so on) of the BJT 100A are disposed within an area surrounded by the continuous inner side wall of the STI region 120. For example, compared with the traditional BJT that the base dielectric layer is formed over the STI region and completely overlaps the STI region, the base dielectric layer 122 is surrounded by the continuous inner side wall of the STI region 120.

Compared with the traditional BJT, no STI region is formed within the OD area 170A of the collector region 104 in the BJT 100A. In other words, no STI region is formed between two adjacent emitter regions 110, i.e., the OD area 170A is free of STI region 120. Furthermore, compared with the distance Dt between the emitter area and the STI region within the OD area of the traditional BJT, the distance D1, D2, D3 or D4 between the emitter area 115 and the STI region 120a/120b is increased to eliminate the STI cumulated phosphorus effect, e.g., D4>D3>D2>D1>Dt, therefore the breakdown voltage BVceo of the BJT 100A is increased.

Figure 3:
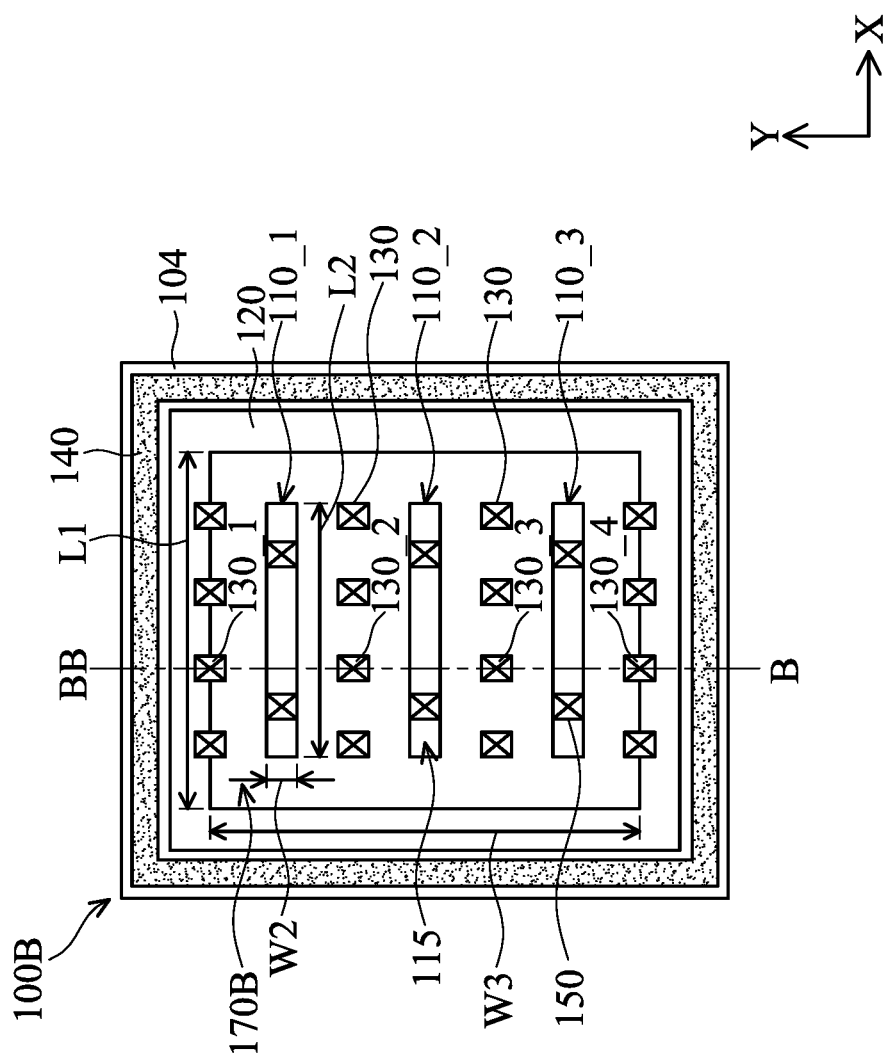
FIG. 3 shows a top view of a BJT, in accordance with some embodiments of the disclosure.

FIG. 3 shows a top view of a BJT 100B, in accordance with some embodiments of the disclosure. The configuration of BJT 100B is similar to the configuration of BJT 100A in FIG. 1. The difference between the BJT 100B and the BJT 100A is that the BJT 100B has less emitter regions. In FIG. 3, the BJT 100B includes 3 emitter regions 110_1 through 110_3 extending in the X direction.

In FIG. 3, the collector contact 140 forms a single loop to surround the STI region 120, i.e., no collector contact is present inside the single loop of the collector contact 140. The STI region 120 forms a single loop to surround the base contacts 130 and the emitter regions 110_1 through 110_3, i.e., no STI region is present inside the single loop of the STI region 120. An OD area 170B of the collector region 104 is surrounded and defined by the single loop of the STI region 120, and the OD area 170B has a width W3 in the Y direction and a length L1 in the X direction. In some embodiments, the width W3 is less than the width W1 of FIG. 1. The emitter contacts 150 and the emitter regions 110_1 through 110_3 are formed over the OD area 170B.

It is noted that some base contacts 130 overlap the OD area 170B and the STI region 120, and the remaining base contacts 130 are formed over the OD area 170B without overlapping the STI region 120. For example, the base contacts 130 between the emitter regions 110_1 and 110_2 and between the emitter regions 110_2 and 110_3 are formed over the OD area 170B of the collector region 104. Moreover, the base contacts 130 between the emitter regions 110_1 and the STI 120 and between the emitter regions 110_3 and the STI 120 are formed over the boundary of the STI 120, e.g., the interface between the OD area 170B and the STI 120.

In the BJT 100B, the emitter area 115 has the width W2 in the Y direction and the length L2 in the X direction. In other words, the emitter area 115 of the BJT 100B in FIG. 3 and the emitter area 115 of the BJT 100A in FIG. 1 are the same in size. In some embodiments, the OD area 170B is 3 to 8 times larger than the whole emitter areas 115 of the emitter regions 110_1 through 110_3 in the BJT 100B. In some embodiments, the OD area 170B is 4.6 to 5.3 times larger than the whole emitter areas 115 of the emitter regions 110_1 through 110_3 in the BJT 100B.

Figure 4:
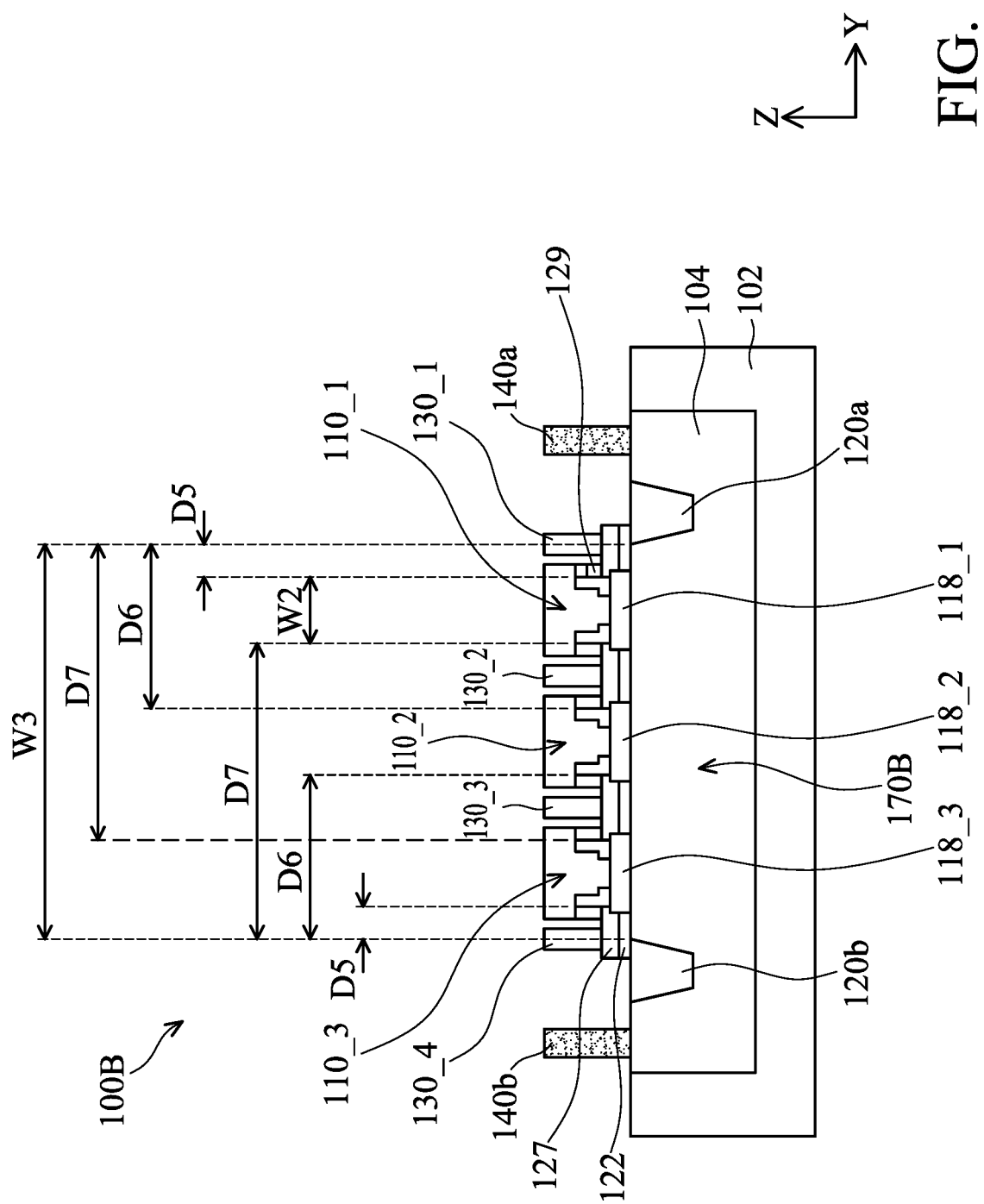
FIG. 4 shows a cross-sectional view of the BJT along line B-BB in FIG. 3, in accordance with some embodiments of the disclosure.

FIG. 4 shows a cross-sectional view of the BJT 100B along line B-BB in FIG. 3, in accordance with some embodiments of the disclosure. Similarly, the configuration of BJT 100B of FIG. 4 is similar to the configuration of BJT 100A in FIG. 2. The difference between the cross-sectional view of the BJT 100B and the BJT 100A is that the base dielectric layer 122 between the emitter region 110_1 and the collector contact 140a and the base dielectric layer 122 between the emitter region 110_3 and the collector contact 140b partially overlap and contact the STI region 120a/120b. Furthermore, the base dielectric layer 122 between the emitter regions 110_1 through 110_3 are in contact with the collector region 104. In other words, the base dielectric layer 122 between the emitter regions 110_1 through 110_3 does not overlap the STI region 120a/120b. Moreover, the base contact 130_1 partially overlaps the STI region 120a, and the base contact 130_4 partially overlaps the STI region 120b. In other words, the areas of the base contacts 130_2 and 130_3 projected onto the OD area 170B is separated from the STI region 120a/120b, and the areas of the base contacts 130_1 and 130_4 projected onto the OD area 170B overlap the STI region 120a/120b. Compared with the traditional BJT that the base dielectric layer is formed over the STI region and completely overlaps the STI region, only a part of the base dielectric layer 122 that is close to the collector contact 140a/b overlap the STI region 120 in the BJT 100B.

In FIG. 4, each of the emitter regions 110_1 through 110_3 is far away from the STI region 120a/120b. For example, a distance between the STI region 120a and the emitter area 115 of the emitter region 110_1 is D5. A distance between the STI region 120a and the emitter area 115 of the emitter region 110_2 is D6, and D6 is greater than D5, i.e., D5 is the minimum distance in FIG. 4. A distance between the STI region 120a and the emitter area 115 of the emitter region 110_3 is D7, and D7 is greater than D6, i.e., D7 is the maximum distance in FIG. 4. Similarly, a distance between the STI region 120b and the emitter area 115 of the emitter region 110_3 is D5, a distance between the STI region 120b and the emitter area 115 of the emitter region 110_2 is D6, and a distance between the STI region 120b and the emitter area 115 of the emitter region 110_1 is D7. For each of the emitter regions 110_1 and 110_3, a distance between the emitter region and the STI region 120a is different from a distance between the emitter region and the STI region 120b. Taking the emitter region 110_3 as an example, the distance between the emitter region 110_3 and the STI region 120a is D7, and the distance between the emitter region 110_3 and the STI region 120b is D5. Moreover, for the emitter region 110_2, a distance between the emitter region 110_2 and the STI region 120a is equal to a distance between the emitter region 110_2 and the STI region 120b, i.e., D6.

In some embodiments, the difference between the distances D5 and D6, and the difference between the distances D6 and D7 are the same and equal to the fixed distance Dx, i.e., D6−D5=D7−D6=Dx. In some embodiments, the difference between the distances D5 and D6 and the difference between the distances D6 and D7 are different.

In some embodiments, the width W3 of the OD area 170B is determined according to the maximum distance D7, the minimum distance D5 and the width W2 of the emitter area 115. For example, the width W3 of the OD area 170B is the sum of the maximum distance D7, the minimum distance D5 and the width W2, e.g., W3=D7+D5+W2.

In FIG. 3 and FIG. 4, the STI region 120 is a ring-shaped STI having a single continuous inner side wall and a continuous outer side wall. The emitter regions 110_1 through 110_3, the base regions 118_1 through 118_3 and related components (e.g., the base dielectric layer 122, the base conductive layer 127, the spacer layer 125 and so on) of the BJT 100B are disposed within the OD area 170B that is surrounded by the continuous inner side wall of the STI region 120. Therefore, no STI region is formed within the OD area 170B of the collector region 104 in the BJT 100B. In other words, no STI region is formed between two adjacent emitter regions 110, i.e., the OD area 170B is free of STI region 120. Furthermore, the breakdown voltage BVceo of the BJT 100B is increased because the distance D5, D6 or D7 between the emitter area 115 and the STI region 120a/120b is increased to eliminate the STI cumulated phosphorus effect.

Figure 5:
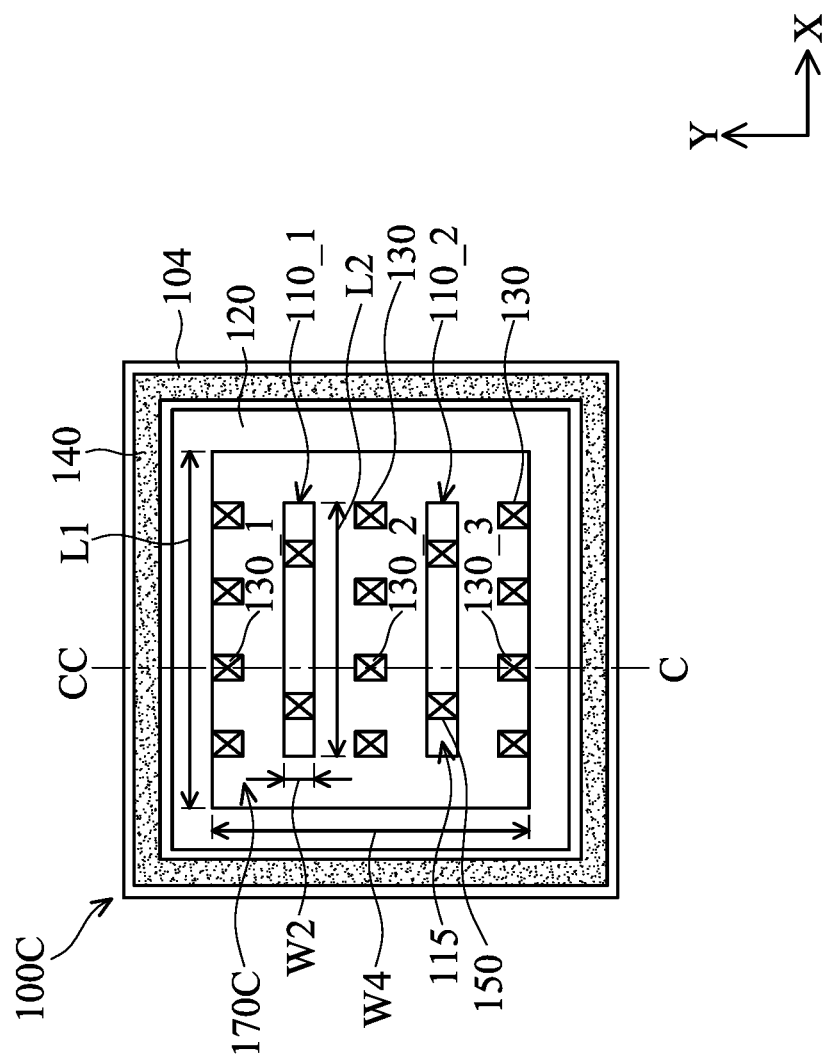
FIG. 5 shows a top view of a BJT, in accordance with some embodiments of the disclosure.

FIG. 5 shows a top view of a BJT 100C, in accordance with some embodiments of the disclosure. The configuration of BJT 100C is similar to the configuration of BJT 100B in FIG. 3. The difference between the BJT 100C and the BJT 100B is that the BJT 100C has less emitter regions. In FIG. 5, the BJT 100C includes 2 emitter regions 110_1 and 110_2 extending in the X direction.

In FIG. 5, the collector contact 140 forms a single loop to surround the STI region 120, i.e., no collector contact is present inside the single loop of the collector contact 140. The STI region 120 forms a single loop to surround the base contacts 130 and the emitter regions 110_1 and 110_2, i.e., no STI region is present inside the single loop of the STI region 120. An OD area 170C of the collector region 104 is surrounded and defined by the single loop of the STI region 120, and the OD area 170C has a width W4 in the Y direction and a length L1 in the X direction. In some embodiments, the width W4 is less than the width W3 of FIG. 3. The base contacts 130, the emitter contacts 150 and the emitter regions 110_1 and 110_2 are formed over the OD area 170C.

It is noted that the edge of the upper surface of some base contacts 130 are aligned with the edge of the upper surface of the STI region 120 in layout. For example, the edges of the upper surface of the base contacts 130 between the emitter regions 110_1 and the STI 120 and the edges of the upper surface of the base contacts 130 between the emitter regions 110_2 and the STI 120 are arranged to align with the interface of the upper surface of the STI 120.

In the BJT 100C, the emitter area 115 has the width W2 in the Y direction and the length L2 in the X direction. In other words, the emitter area 115 of the BJT 100C in FIG. 5 and the emitter area 115 of the BJT 100B in FIG. 3 are the same in size. In some embodiments, the OD area 170C is 3 to 8 times larger than the whole emitter areas 115 of the emitter regions 110_1 and 1102 in the BJT 100C. In some embodiments, the OD area 170C is 4.6 to 5.3 times larger than the whole emitter areas 115 of the emitter regions 110_1 and 110_2 in the BJT 100C.

Figure 6:
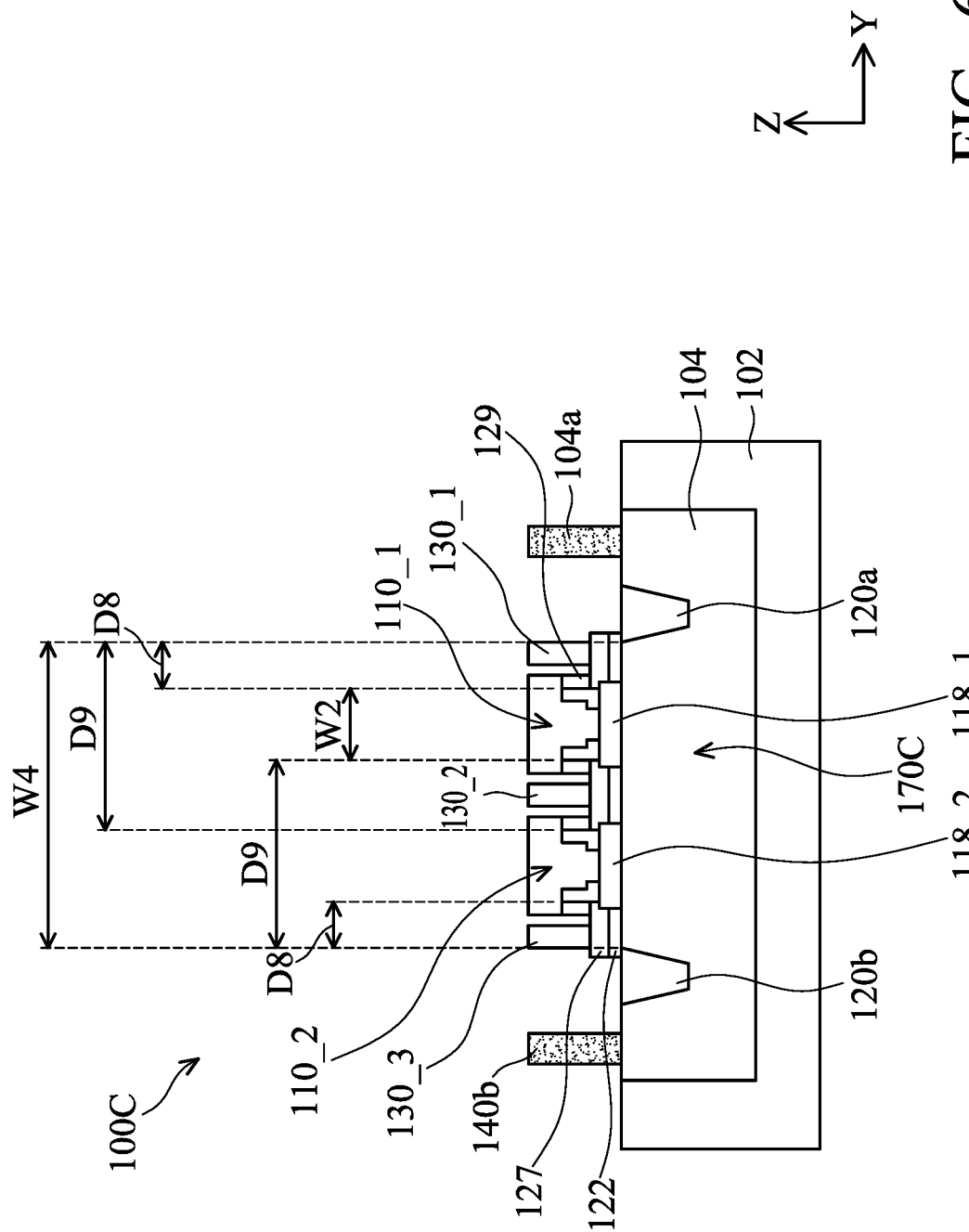
FIG. 6 shows a cross-sectional view of the BJT along line C-CC in FIG. 5, in accordance with some embodiments of the disclosure.

FIG. 6 shows a cross-sectional view of the BJT 100C along line C-CC in FIG. 5, in accordance with some embodiments of the disclosure. Similarly, the configuration of BJT 100C of FIG. 6 is similar to the configuration of BJT 100B in FIG. 4. The difference between the cross-sectional view of the BJT 100C and the BJT 100B is that the base contact 130_1 does not overlap the STI region 120a, and the base contact 130_3 does not overlap the STI region 120b. In other words, the area of the base contact 1302 projected onto the OD area 170C is separated from the STI region 120a/120b, and the areas of the base contacts 130_1 and 130_3 projected onto the OD area 170C overlap the STI region 120a/120b.

In FIG. 6, each of the emitter regions 110_1 and 1102 is far away from the STI region 120a/120b. For example, a distance between the STI region 120a and the emitter area 115 of the emitter region 110_1 is D8. A distance between the STI region 120a and the emitter area 115 of the emitter region 1102 is D9, and D9 is greater than D8. In FIG. 6, D8 is the minimum distance and D9 is the maximum distance in the BJT 100C. Similarly, a distance between the STI region 120b and the emitter area 115 of the emitter region 110_2 is D8, and a distance between the STI region 120b and the emitter area 115 of the emitter region 110_1 is D9. For each of the emitter regions 110_1 and 1102, a distance between the emitter region and the STI region 120a is different from a distance between the emitter region and the STI region 120b. Taking the emitter region 1102 as an example, the distance between the emitter region 110_2 and the STI region 120a is D9, and the distance between the emitter region 110_3 and the STI region 120b is D8.

In some embodiments, the width W4 of the OD area 170C is determined according to the maximum distance D9, the minimum distance D8 and the width W2 of the emitter area 115. For example, the width W4 of the OD area 170C is the sum of the maximum distance D9, the minimum distance D8 and the width W2, e.g., W4=D9+D8+W2.

In FIG. 5 and FIG. 6, the STI region 120 is a ring-shaped STI having a single continuous inner side wall and a continuous outer side wall. The emitter regions 110_1 and 110_2, the base regions 118_1 and 118_2 and related components (e.g., the base dielectric layer 122, the base conductive layer 127, the spacer layer 125 and so on) of the BJT 100C are disposed within the OD area 170C that is surrounded by the continuous inner side wall of the STI region 120. Therefore, no STI region is formed within the OD area 170C of the collector region 104 in the BJT 100C. In other words, no STI region is formed between two adjacent emitter regions 110, i.e., the OD area 170C is free of STI region 120. Furthermore, the breakdown voltage BVceo of the BJT 100C is increased because the distance D8 or D9 between the emitter area 115 and the STI region 120a/120b is increased to eliminate the STI cumulated phosphorus effect.

Figure 7:
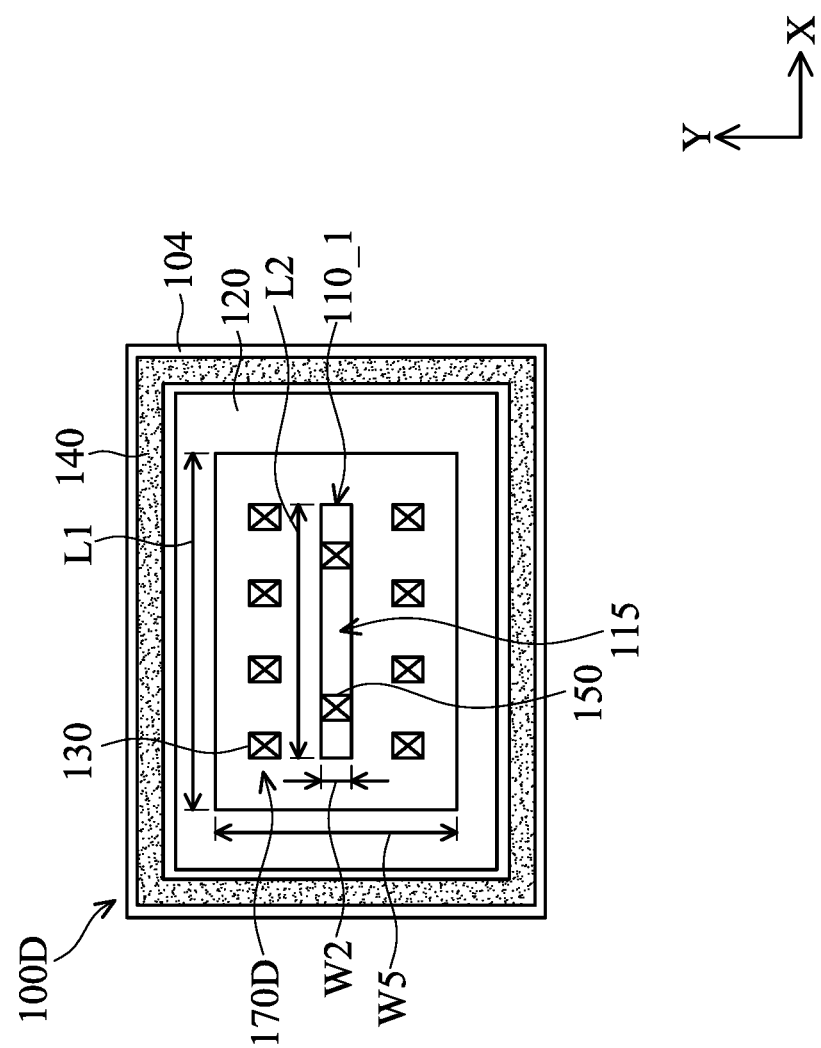
FIG. 7 shows a top view of a BJT, in accordance with some embodiments of the disclosure.

FIG. 7 shows a top view of a BJT 100D, in accordance with some embodiments of the disclosure. The configuration of BJT 100D is similar to the configuration of BJT 100C in FIG. 5. The difference between the BJT 100D and the BJT 100C is that the BJT 100D has less emitter regions. In FIG. 7, the BJT 100D includes one emitter region 110_1 extending in the X direction.

In FIG. 7, the collector contact 140 forms a single loop to surround the STI region 120. The STI region 120 forms a single loop to surround the base contacts 130 and the emitter regions 110. An OD area 170D of the collector region 104 is surrounded and defined by the single loop of the STI region 120, and the OD area 170D has a width W5 in the Y direction and a length L1 in the X direction. In some embodiments, the width W5 is less than the width W4 of FIG. 5. The base contacts 130, the emitter contacts 150 and the emitter region 110_1 are formed over the OD area 170D.

Furthermore, similar to the cross-sectional view of the BJT 100A in FIG. 2, the base dielectric layer corresponding to the base contacts 130 is separated from the STI region 120 (e.g., STI region 120a/120b). It is noted that the base contacts 130 do not overlap the STI region 120. In other words, the area of the base contact 1302 projected onto the OD area 170D is separated from the STI region 120.

In the BJT 100D, the emitter area 115 has the width W2 in the Y direction and the length L2 in the X direction. In other words, the emitter area 115 of the BJT 100D in FIG. 7 and the emitter area 115 of the BJT 100C in FIG. 5 are the same in size. In some embodiments, the OD area 170D is 3 to 8 times larger than the emitter area 115 of the emitter region 110_1. In some embodiments, the OD area 170C is 4.6 to 5.3 times larger than the emitter area 115 of the emitter region 110_1.

Figure 8:
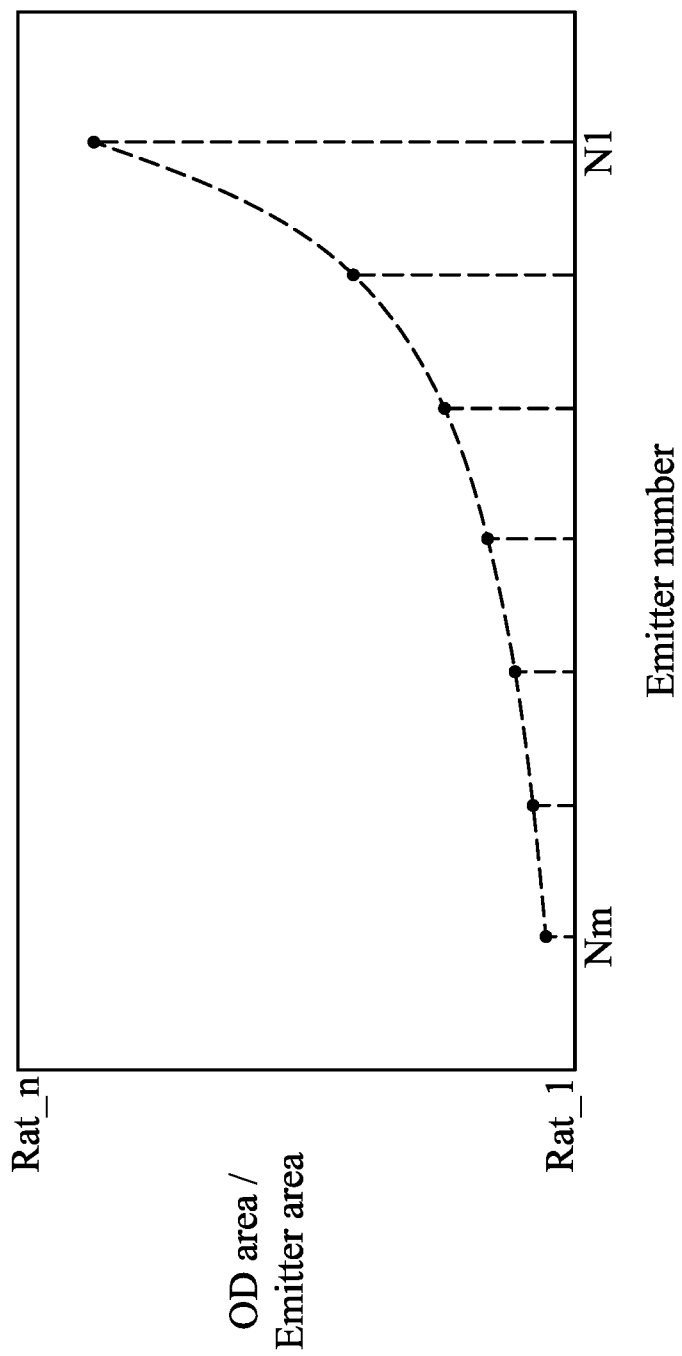
FIG. 8 shows a curve illustrating the relationship between the ratio of the OD area to the emitter areas that are projected onto the OD area and the number of emitter regions of a BJT.

FIG. 8 shows a curve illustrating the relationship between the ratio of the OD area to the emitter areas that are projected onto the OD area and the number of emitter regions of the BJT. It is assumed that the emitter regions of the BJT have the same emitter area, e.g., the emitter area 150 of the emitter regions 110. In FIG. 8, when the number of emitter regions within the OD area is decreased from Nm to N1, the ratio of the OD area to the emitter areas is increased from Rat_1 to Rat_n. Therefore, by adjusting the number of emitter regions, the ratio of the OD area to the emitter areas is controllable. In some embodiments, the ratio of the OD area to the emitter areas can be kept between 3 and 8. In some embodiments, the ratio of the OD area to the emitter areas can be kept between 4.6 and 5.3.

Figure 9:
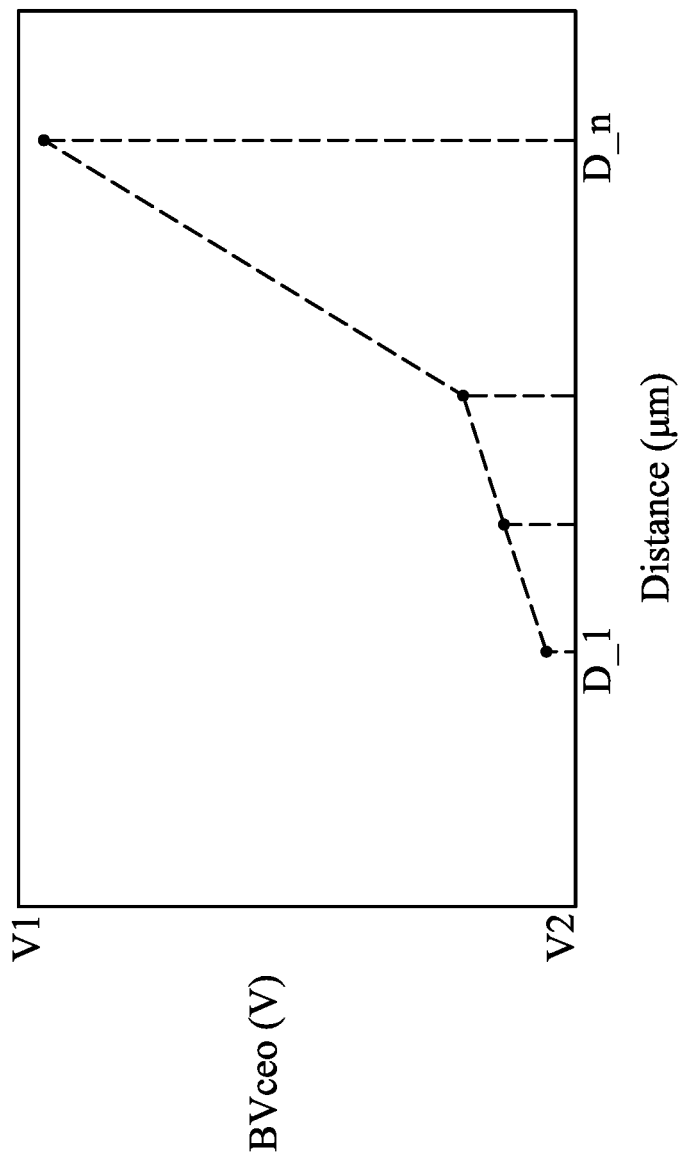
FIG. 9 shows a curve illustrating the relationship between the distance between the STI region and the emitter region and the breakdown voltage BVceo of a BJT.

FIG. 9 shows a curve illustrating the relationship between the distance between the STI region and the emitter region and the breakdown voltage BVceo of a BJT. The breakdown voltage BVceo represents a breakdown voltage of the collector region to the emitter region of the BJT. In FIG. 9, when the distance between the STI region and the emitter region is increased from D_1 to D_n, the breakdown voltage BVceo is increased from V1 to V2. In some embodiments, the breakdown voltage BVceo is greater than 12V, e.g., V1>12V.

Figure 10:
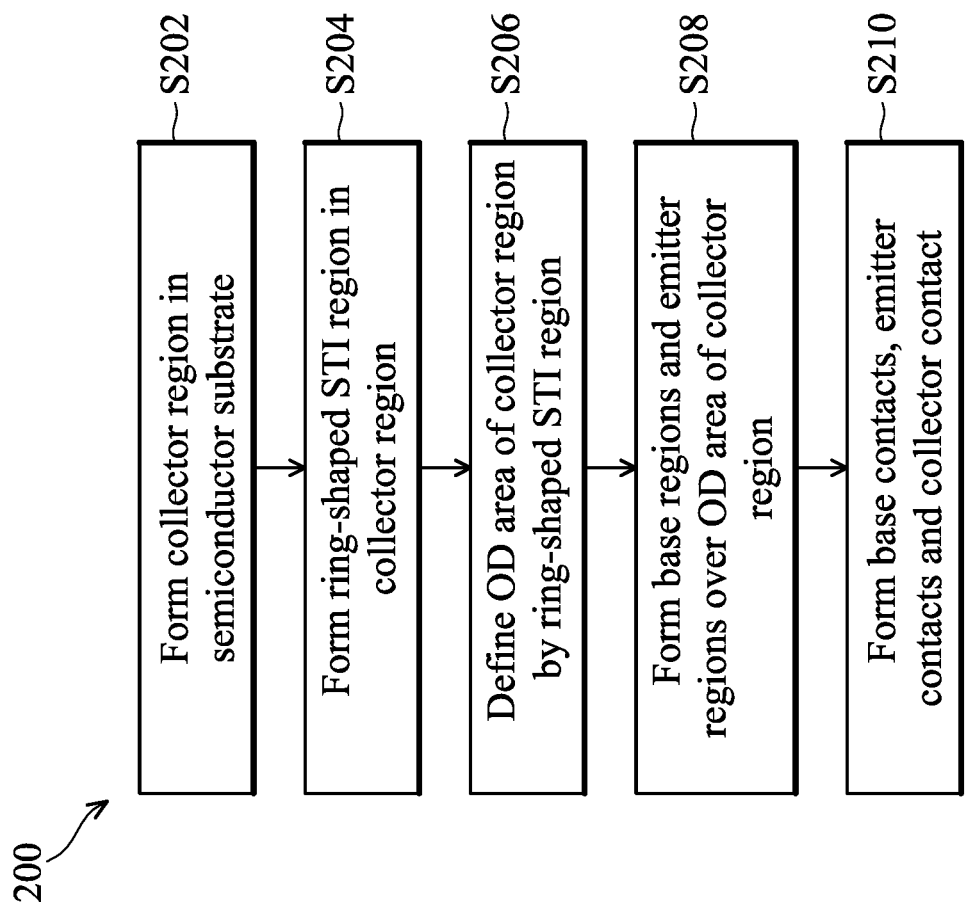
FIG. 10 shows a flow chart of a method for fabricating a BJT, in accordance with some embodiments of the disclosure.

FIG. 10 shows a flow chart of a method 200 for fabricating a BJT, in accordance with some embodiments of the disclosure. While the method 200 is described as a series of operations or acts, it will be appreciated that the illustrated ordering of such operations or acts are not to be interpreted in a limiting sense. For example, some operations may occur in different orders and/or concurrently with other operations or acts apart from those illustrated and/or described herein. In addition, not all illustrated operations may be required to implement one or more aspects or embodiments of the description herein. Further, one or more of the operations depicted herein may be carried out in one or more separate operations and/or phases.

In operation 202, a collector region (e.g., the collector region 104) having a first conductivity type (e.g., N-type or P-type) is formed within a semiconductor substrate (e.g., the semiconductor substrate 102). In some embodiments, the collector region is formed by the IMP process with the dosage about 1E10-5E12 atom/cm2.

In operation 204, a STI region (e.g., STI region 120) is formed in the collector region. As described above, the STI region is a ring-shaped STI region. In some embodiments, a shallow trench is formed in the collector region through an etch process by using one or more masks that have been disposed over an upper surface of the collector region. The mask has then been patterned to form a trench. Next, the trench has been filled with a dielectric material (e.g., SiO$_2$) to form the STI region (e.g., the STI region 120), thus an OD area of the collector region is defined by the STI region (in operation S206). In some embodiments, filling with the dielectric material includes deposition processes, such as CVD (e.g., low-pressure CVD (LPCVD) or plasma-enhanced CVD (PECVD)), physical vapor deposition (PVD), atomic layer deposition (ALD), molecular beam epitaxy (MBE), electron beam (e-beam) epitaxy, or other appropriate process. As described above, no STI region is formed within the OD area of the collector region.

In operation 208, one or more base regions having a second conductivity type (e.g., base regions 118_1 through 118_4) and emitter regions having the first conductivity type (e.g., emitter regions 110_1 through 110_4) of the BJT are formed over the OD region. As described above, each emitter region is over the corresponding base region. It is noted that no STI region is formed between two adjacent emitter regions or two adjacent base regions.

Furthermore, the number of base regions is equal to the number of emitter regions over the OD region. As described above, by adjusting the number of emitter regions, the ratio of the OD area to the emitter areas corresponding to the emitter regions is controllable. In some embodiments, the ratio of the OD area to the emitter areas can be kept between 3 and 8. In some embodiments, the ratio of the OD area to the emitter areas can be kept between 4.6 and 5.3.

In operation 210, the emitter contacts (e.g., the emitter contacts 150), the base contacts (e.g., the base contacts 130) and the collector contact 140 are formed. As described above, the collector contact is formed outside the STI region, and the base contacts and the emitter contacts are formed over the OD region.

Next, processing can continue to complete the device with the BJT. This can include the formation of other devices, contacts, metal lines, etc. Therefore, for the high voltage device with the BJT, such as a power device, the electrostatic discharge (ESD) device and so on, the BJT having high breakdown voltage BVceo is provided. In some embodiments, the breakdown voltage BVceo of the BJT is greater than 12V.

Embodiments of BJT with high breakdown voltage BVceo are provided. The BJT has larger distance between the emitter area and the STI region, thereby eliminating the STI cumulated phosphorus effect. Thus, the breakdown voltage of the BJT is increased. Compared with the traditional BJT, the OD areas are merged to obtain a larger OD area for the collector region. Multiple emitter regions and multiple base regions are formed over the OD area, and no STI is formed within the larger OD area.

In some embodiments, a bipolar junction transistor (BJT) structure is provided. The BJT structure includes a semiconductor substrate, a collector region formed in the semiconductor substrate, a base region formed over the collector region, an emitter region formed over the collector region, a ring-shaped shallow trench isolation (STI) region formed in the collector region, and a base dielectric layer formed over the collector region and on opposite sides of the base region. The base dielectric layer is surrounded by an inner side wall of the ring-shaped STI region.

In some embodiments, a bipolar junction transistor (BJT) structure is provided. The BJT structure includes a semiconductor substrate, a collector region formed in the semiconductor substrate, a shallow trench isolation (STI) region formed in the collector region, a plurality of base regions formed over a first area of the collector region, and a plurality of emitter regions formed over the first area of the collector region. The first area of the collector region is surrounded by an inner side wall of the STI region. The first area of the collector region is 3 to 8 times larger than a second area of the emitter regions projected onto the first area of the collector region.

In some embodiments, a method for fabricating a bipolar junction transistor (BJT) is provided. A collector region of the BJT is formed within a semiconductor substrate. A shallow trench isolation (STI) region is formed within the collector region. A plurality of base regions of the BJT are formed over a first area of the collector region surrounded by the STI region. A plurality of emitter regions of the BJT are formed over the first area of the collector region. The first area of the collector is free of the shallow trench isolation region.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bipolar junction transistor (BJT) structure, comprising:
   a semiconductor substrate;
   a collector region formed in the semiconductor substrate;
   a plurality of base regions formed over the collector region;
   a plurality of emitter regions formed over the base regions;
   a ring-shaped shallow trench isolation (STI) region formed in the semiconductor substrate;
   a plurality of base dielectric layers formed over the collector region and on opposite sides of the base regions;
   a plurality of base conductive layers formed over and in contact with the base dielectric layers and on the opposite sides of the base regions, wherein the base conductive layers are in contact with sidewalls and top surfaces of the base regions;
   a plurality of base contacts formed over the base conductive layers,
   wherein the base dielectric layers are surrounded by an outer side wall of the ring-shaped STI region,
   wherein a top surface of the collector region is coplanar with bottom surfaces of the base regions and bottom surfaces of the base dielectric layers,
   wherein the base contacts are divided into a first group of base contacts disposed between the base regions and a second group of base contacts disposed between the base regions and the STI region.

2. The BJT structure as claimed in claim 1, wherein the base dielectric layers are in contact with the collector region.

3. The BJT structure as claimed in claim 1, further comprising:
   a collector contact formed over the collector region,
   wherein the ring-shaped STI region is surrounded by the collector contact.

4. The BJT structure as claimed in claim 1, wherein a first area of the semiconductor substrate surrounded by the ring-shaped STI region is 3 to 8 times larger than a second area of the emitter regions projected onto the first area.

5. The BJT structure as claimed in claim 1, wherein the base dielectric layers partially overlap the ring-shaped STI region.

6. The BJT structure as claimed in claim 1, wherein the ring-shaped STI region is laterally separated from the base regions by the base dielectric layers.

7. A bipolar junction transistor (BJT) structure, comprising:
   a semiconductor substrate;
   a collector region formed in the semiconductor substrate;
   a shallow trench isolation (STI) region formed in the collector region;
   a plurality of base regions formed over a first area of the collector region, wherein the first area of the collector region is surrounded by an inner side wall of the STI region;
   a plurality of emitter regions formed over the base regions;
   a base dielectric layer formed over the collector region and on opposite sides of the base regions, wherein a top surface of the collector region is coplanar with bottom surfaces of the base regions and a bottom surface of the base dielectric layer;
   a base conductive layer formed over and in contact with the base dielectric layer and on the opposite sides of the base regions, wherein the base conductive layer is in contact with sidewalls and top surfaces of the base regions; and
   a plurality of base contacts formed over the base conductive layer,
   wherein the first area of the collector region is 3 to 8 times larger than a second area of the emitter regions projected onto the first area of the collector region,
   wherein the base contacts are divided into a first group of base contacts disposed between the base regions and a second group of base contacts disposed between the base regions and the STI region,
   wherein the first group of base contacts is formed over the first area of the collector region.

8. The BJT structure as claimed in claim 7, further comprising:
   a plurality of emitter contacts formed over the emitter regions,
   wherein the base dielectric layer is between the base contacts and the collector region,
   wherein the base dielectric layer corresponding to the first group of base contacts is in contact with the collector region.

9. The BJT structure as claimed in claim 7, wherein the emitter regions extend in the first direction, and the number of base contacts in the first group of base contacts between two adjacent base regions is greater than 2.

10. The BJT structure as claimed in claim 7, wherein the second group of base contacts partially overlaps the STI region, and the first group of base contacts is separated from the STI region.

11. The BJT structure as claimed in claim 7, further comprising:
    a collector contact formed over the collector region,
    wherein the STI region is surrounded by the collector contact.

12. The BJT structure as claimed in claim 7, wherein a portion of the semiconductor substrate located between the base regions is free of the STI region.

13. A bipolar junction transistor (BJT) structure, comprising:
    a semiconductor substrate;
    a collector region formed in the semiconductor substrate;
    a plurality of base regions formed over the collector region;
    a plurality of base dielectric layers formed over the collector region and on opposite sides of the base regions, wherein a top surface of the collector region is coplanar with bottom surfaces of the base regions and bottom surfaces of the base dielectric layers;
    a plurality of base conductive layers formed over and in contact with the base dielectric layers and on the opposite sides of the base regions, wherein the base conductive layers are in contact with sidewalls and top surfaces of the base regions;

a plurality of emitter regions formed over the base regions;

a plurality of spacer layers arranged along vertical sidewalls of the emitter regions, wherein the spacer layers electrically isolate the emitter regions from the base conductive layers;

a shallow trench isolation (STI) region formed in the collector region; and a plurality of base contacts formed over the base conductive layers, wherein the base regions are surrounded by an inner side of the STI region, wherein the base contacts are divided into a first group of base contacts disposed between the base regions and a second group of base contacts disposed between the base regions and the STI region.

14. The BJT structure as claimed in claim 13, further comprising:

a collector contact formed over the collector region, wherein the STI region is surrounded by the collector contact.

15. The BJT structure as claimed in claim 13, wherein the second group of base contacts partially overlaps the STI region, and the first group of base contacts is separated from the STI region.

16. The BJT structure as claimed in claim 13, wherein a first area of the semiconductor substrate surrounded by the STI region is 3 to 8 times larger than a second area of the emitter regions projected onto the first area.

17. The BJT structure as claimed in claim 13, wherein a portion of the semiconductor substrate located between the base regions is free of the STI region.

18. The BJT structure as claimed in claim 13, further comprising:

a plurality of emitter contacts formed over the emitter regions.

19. The BJT structure as claimed in claim 13, wherein the base dielectric layer is between the base contacts and the collector region, and wherein the base dielectric layer corresponding to the first group of base contacts is in contact with the collector region.

20. The BJT structure as claimed in claim 13, further comprising:

a plurality of dielectric layers formed over the base conductive layers and in contact with the spacer layers, wherein upper surfaces of the dielectric layers are aligned with upper surfaces of the spacer layers.

* * * * *